(12) United States Patent
Ji et al.

(10) Patent No.: US 12,721,226 B2
(45) Date of Patent: Aug. 25, 2026

(54) PACKAGING MODULE AND ELECTRONIC DEVICE

(71) Applicant: HUAWEI TECHNOLOGIES CO., LTD., Shenzhen (CN)

(72) Inventors: Zhongli Ji, Shenzhen (CN); Wei Xu, Yokohama (JP)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 498 days.

(21) Appl. No.: 18/325,306

(22) Filed: May 30, 2023

(65) Prior Publication Data

US 2023/0307428 A1 Sep. 28, 2023

Related U.S. Application Data

(63) Continuation of application No. PCT/CN2021/097931, filed on Jun. 2, 2021.

(30) Foreign Application Priority Data

Nov. 30, 2020 (CN) ......................... 202011380744.2

(51) Int. Cl.
*H10W 90/00* (2026.01)
*H10W 70/685* (2026.01)
(Continued)

(52) U.S. Cl.
CPC ......... *H10W 90/00* (2026.01); *H10W 70/685* (2026.01); *H10W 74/114* (2026.01);
(Continued)

(58) Field of Classification Search
CPC ............. H01L 23/5389; H01L 23/5386; H01L 23/49838; H01L 25/18; H01L 25/03;
(Continued)

(56) References Cited

U.S. PATENT DOCUMENTS 6,703,713 B1 3/2004 Tseng et al.
7,554,185 B2 6/2009 Foong et al.
(Continued)

FOREIGN PATENT DOCUMENTS

CN 104392979 A 3/2015
CN 105006470 A 10/2015
(Continued)

OTHER PUBLICATIONS

Office Action dated Jul. 31, 2023, issued for Chinese Application No. 202011380744.2 (12 pages).
(Continued)

*Primary Examiner* — Jasmine J Clark

(57) ABSTRACT

A packaging module includes a substrate layer disposed in a stacking manner, and a plurality of chip layers stacked on the substrate layer. The plurality of chip layers include a top chip layer, and the top chip layer is a chip layer furthest from the substrate layer in the plurality of chip layers. The top chip layer includes a first chip, a connection surface of the first chip faces the substrate layer, and the connection surface of the first chip is conductively connected to a chip of an adjacent chip layer by using a first conductor. The connection surface of the first chip faces the substrate layer, so that the first conductor connected to the first chip and another chip does not occupy additional space, to reduce the thickness of the packaging module, and facilitate miniaturization of the packaging module.

20 Claims, 6 Drawing Sheets

(51) Int. Cl.
*H10W 72/00* (2026.01)
*H10W 72/30* (2026.01)
*H10W 74/10* (2026.01)

(52) U.S. Cl.
CPC .... *H10W 72/07352* (2026.01); *H10W 72/327* (2026.01); *H10W 72/859* (2026.01); *H10W 72/865* (2026.01); *H10W 72/877* (2026.01); *H10W 90/724* (2026.01); *H10W 90/732* (2026.01); *H10W 90/734* (2026.01); *H10W 90/752* (2026.01); *H10W 90/754* (2026.01)

(58) Field of Classification Search
CPC ..... H01L 25/50; H01L 25/0652; H01L 24/29; H01L 2224/48248; H01L 2225/06506; H01L 2225/0651; H01L 2225/06517; H01L 2225/06548; H01L 2225/06562; H01L 2225/06586; H01L 2225/06524; H10W 90/00; H10W 70/685; H10W 74/114; H10W 72/327; H10W 72/859; H10W 72/865; H10W 72/877; H10W 72/07352; H10W 90/724; H10W 90/732; H10W 90/734; H10W 90/752; H10W 90/754
USPC .......................................................... 257/686
See application file for complete search history.

(56) References Cited

U.S. PATENT DOCUMENTS 8,970,049 B2 3/2015 Karnezos
10,236,276 B2 3/2019 Liu et al.
11,688,721 B2 * 6/2023 Zeng .................... H01L 25/105 257/686
2008/0308950 A1 12/2008 Yoo et al.
2010/0109143 A1 5/2010 Cho
2010/0320586 A1 * 12/2010 Bathan ................. H01L 21/568 257/E23.068
2011/0304044 A1 12/2011 Lin
2017/0033087 A1 2/2017 Chen
2018/0190617 A1 7/2018 Chew

FOREIGN PATENT DOCUMENTS

CN 105870024 A 8/2016
CN 106129015 A 11/2016
CN 206236120 U 6/2017
CN 103915413 B 10/2017
CN 109585431 A 4/2019
CN 112614830 A 4/2021
JP 2003031760 A 1/2003
JP 2014150265 A 8/2014
KR 20070088177 A 8/2007
KR 101686199 B1 12/2016
KR 20200000785 A 1/2020

OTHER PUBLICATIONS

International Search Report and Written Opinion dated Aug. 18, 2021 for International Application No. PCT/CN2021/097931 (12 pages).
Office Action dated Aug. 19, 2022, issued for Chinese Office Action 202011380744.2 (11 pages).
Extended European Search Report dated Jun. 18, 2024, issued for European Application No. 21896255.3 (14 pages).
Notice to Submit a Response dated Jul. 30, 2024, issued for Korean Application No. 10-2023-7022063 (7 pages) and Translation.
Notice of Reasons for Rejection dated Aug. 5, 2024, issued for Japanese Application No. 2023-532830 (3 pages) and Translation.

* cited by examiner

PACKAGING MODULE AND ELECTRONIC DEVICE

CROSS-REFERENCE TO RELATED APPLICATIONS

This application is a continuation of International Application No. PCT/CN2021/097931 filed on Jun. 2, 2021, which claims priority to Chinese Patent Application No. 202011380744.2, filed on Nov. 30, 2020. The disclosures of the aforementioned applications are hereby incorporated by reference in their entireties.

TECHNICAL FIELD

This disclosure relates to the field of chip packaging technologies, and in particular, to a packaging module and an electronic device.

BACKGROUND

A semiconductor device is widely used in electronic devices such as a mobile phone and a smartwatch, and is used as a main electronic component of the electronic devices. With thinning development of the electronic device, a size of a packaging module becomes a main factor restricting further thinning of the electronic device.

With continuous development of the semiconductor industry, a size of the semiconductor device is becoming smaller and a density of internal electronic components of the semiconductor device is becoming higher. In addition, a plurality of semiconductor devices are stacked and packaged to form a packaging module, to further reduce occupied space. However, for a system-level packaging module in the electronic device, because the system-level packaging module needs to carry a relatively large quantity of chips, and a relatively large quantity of substrates are used when the chips are carried, the packaging module cannot further implement miniaturization, and a miniaturization requirement of an existing electronic device cannot be met.

SUMMARY

This disclosure provides a packaging module and an electronic device, to improve a size of the packaging module and facilitate miniaturization development of the packaging module.

According to a first aspect, a packaging module is provided. The packaging module includes a substrate layer disposed in a stacking manner, and a plurality of chip layers stacked on the substrate layer. The substrate layer serves as a supporting structure to support the plurality of chip layers. In addition, the substrate layer is also provided with a circuit layer, to be conductively connected to the chip layer, thereby implementing a function of the packaging module. The plurality of chip layers include a top chip layer, and the top chip layer is a chip layer furthest from the substrate layer in the plurality of chip layers. The top chip layer includes a first chip, a connection surface of the first chip faces the substrate layer, and the connection surface of the first chip is conductively connected to a chip of an adjacent chip layer by using a first conductor. In the foregoing technical solution, all chips are supported by one substrate (the substrate layer), to reduce a quantity of used substrates, and further reduce a thickness of the packaging module. In addition, the connection surface of the first chip faces the substrate layer, so that the first conductor connected to the first chip and another chip does not occupy additional space, to reduce the thickness of the packaging module, and facilitate miniaturization of the packaging module.

In a specific possible implementation, a connection surface of the chip of the adjacent chip layer faces the substrate layer, one end of the first conductor is connected to the connection surface of the first chip, and the other end thereof is connected to the connection surface of the chip of the adjacent chip layer. Therefore, disposition of the first conductor is facilitated.

In a specific possible implementation, the first conductor is located on a side of the first chip facing the substrate layer. This reduces an impact of the first conductor on a height of the packaging module.

In a specific possible implementation, the connection surface of the first chip is provided with an exposed connection area relative to an upper surface of the chip of the adjacent chip layer, and one end of the first conductor is connected to the exposed connection area. Therefore, disposition of the first conductor is facilitated.

In a specific possible implementation, the connection area of the first chip is located in an edge area or a middle area of the connection surface of the first chip. Therefore, disposition of the first conductor is facilitated.

In a specific possible implementation, the conductor is a bonding wire, to facilitate connection between chips of different layers.

In a specific possible implementation, the adjacent chip layer is closer to the substrate layer than the top chip layer, and the adjacent chip layer includes one or more chips. A connection surface or connection surfaces of the one or more chips faces or all face the substrate layer and is or are conductively connected to a circuit layer of the substrate layer. The connection surface of the first chip is connected to any one of the connection surface or the connection surfaces of the one or more chips by using one first conductor. Two chip layers are used to implement a function of the packaging module.

In a specific possible implementation, the adjacent chip layer includes a plurality of chips, and the plurality of chips include a second chip and a third chip. Connection surfaces of the second chip and the third chip both face the substrate layer, and the second chip and the third chip are separately conductively connected to the circuit layer of the substrate layer. The first chip is conductively connected to the second chip by using the first conductor; or the first chip is conductively connected to the second chip by using one first conductor, and the first chip is conductively connected to the third chip by using another first conductor. Two chip layers are used to implement the function of the packaging module.

In a specific possible implementation, the adjacent chip layer includes a plurality of chips, and the plurality of chips include a fourth chip and a fifth chip. A connection surface of the fourth chip faces the substrate layer, and the connection surface of the first chip is conductively connected to the connection surface of the fourth chip by using the first conductor. A connection surface of the fifth chip faces away from the substrate layer, and the connection surface of the fifth chip is conductively connected to the circuit layer of the substrate layer by using a second conductor. Two chip layers are used to implement the function of the packaging module.

In a specific possible implementation, the substrate layer is provided with an avoidance groove for avoiding the first conductor. A thickness of the packaging module is further reduced.

In a specific possible implementation, the plurality of chip layers further include a bottom chip layer, the bottom chip layer is a chip layer closest to the substrate layer, and the adjacent chip layer is located between the bottom chip layer and the top chip layer.

A chip located at the adjacent chip layer includes a sixth chip, and a connection surface of the sixth chip faces the substrate layer. A chip located at the bottom chip layer includes a seventh chip, and a connection surface of the seventh chip faces the substrate layer and is conductively connected to a circuit layer of the substrate layer. The connection surface of the sixth chip is conductively connected to the connection surface of the first chip by using one first conductor, and is conductively connected to the connection surface of the seventh chip by using another first conductor. Three chip layers are used to implement the function of the packaging module.

In a specific possible implementation, the packaging module further includes an embedded chip disposed at the substrate layer, and the embedded chip is conductively connected to the circuit layer of the substrate layer. The thickness of the packaging module is further reduced.

In a specific possible implementation, the plurality of chip layers further include a bottom chip layer, the bottom chip layer is a chip layer closest to the substrate layer, and the adjacent chip layer is located between the bottom chip layer and the top chip layer.

A chip located at the adjacent chip layer includes an eighth chip, and a connection surface of the eighth chip faces the substrate layer. A chip located at the bottom chip layer includes a ninth chip, and a connection surface of the ninth chip faces the substrate layer and is conductively connected to a circuit layer of the substrate layer. The connection surface of the first chip is conductively connected to the connection surface of the eighth chip by using the first conductor, and the connection surface of the ninth chip is conductively connected to the circuit layer of the substrate layer by using a third conductor. Three chip layers are used to implement the function of the packaging module.

In a specific possible implementation, adjacent chip layers in the plurality of chip layers are bonded. This facilitates fastening between chip layers.

In a specific possible implementation, the packaging module further includes a packaging layer that packages the plurality of chip layers. This improves chip security.

According to a second aspect, an electronic device is provided, and the electronic device includes a housing and the packaging module according to any one of the foregoing implementations disposed in the housing. In the foregoing technical solution, all chips are supported by one substrate (the substrate layer), to reduce a quantity of used substrates, and further reduce the thickness of the packaging module. In addition, the connection surface of the first chip faces the substrate layer, so that the first conductor connected to the first chip and another chip does not occupy additional space, to reduce the thickness of the packaging module, and facilitate miniaturization of the packaging module.

DESCRIPTION OF EMBODIMENTS

The following further describes the embodiments of this disclosure with reference to the accompanying drawings.

To facilitate understanding of a packaging module provided in embodiments of this disclosure, an application scenario of the packaging module is first described.

Figure 1:
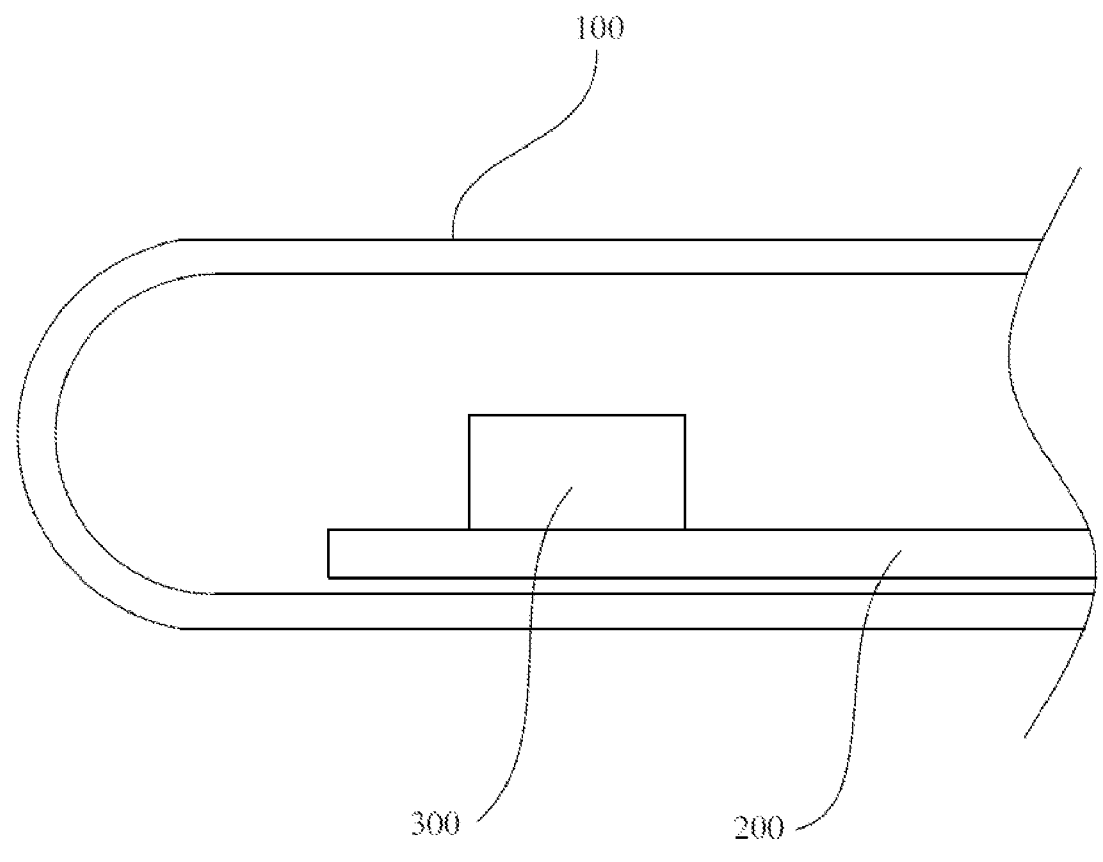
FIG. 1 is a schematic diagram of an application scenario of a packaging module in the conventional technology.

The packaging module provided in the embodiments of this disclosure is applied to an electronic device such as a mobile phone or a smartwatch. FIG. 1 is a schematic diagram of a structure of a packaging module applied to an electronic device. The electronic device includes a housing 100 and a main board 200 disposed in the housing 100. A packaging module 300 is fastened on the main board 200 and is conductively connected to the main board 200.

Figure 2:
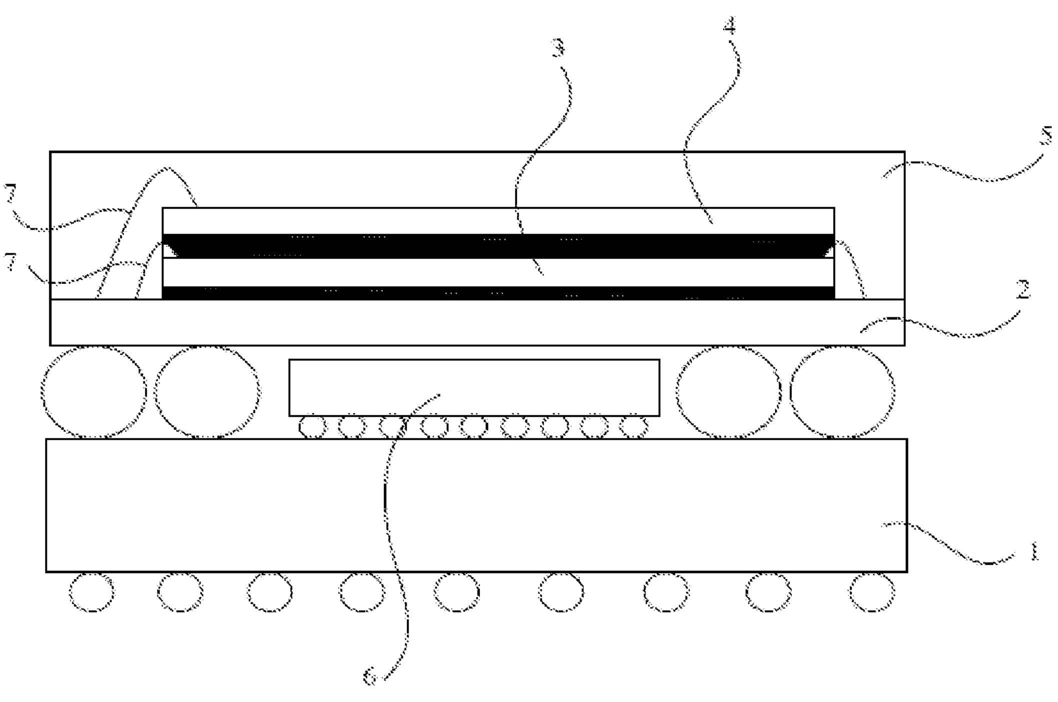
FIG. 2 is a schematic diagram of a structure of a packaging module in the conventional technology.

A conventional system-level packaging module is shown in FIG. 2. The packaging module includes a first substrate 1 and a second substrate 2 that are stacked, and the first substrate 1 and the second substrate 2 are connected by using a solder ball. The first substrate 1 carries a chip 6, and the chip 6 is connected to the first substrate 1 by using a solder ball and is located between the first substrate 1 and the second substrate 2. The second substrate 2 carries a chip 3 and a chip 4 that are stacked and a packaging layer 5 that packages the chip 3 and the chip 4. The chip 3 and the chip 4 are disposed in a positive mounting manner. To be specific, a connection surface of the chip 3 and a connection surface of the chip 4 are located on an upper surface of a chip (a surface of the chip facing away from the second substrate 2). In this embodiment of this disclosure, a connection surface of a chip refers to a surface on which the chip is provided with a solder pad or a window used for conductive connection to another chip or a circuit layer. When the chip 3 and the chip 4 are connected to the second substrate 2, the connection surfaces of the chip 3 and the chip 4 are connected to the second substrate 2 separately by using a bonding wire 7. It can be seen from FIG. 2 that, the packaging module in the conventional technology includes at least two substrates (the first substrate 1 and the second substrate 2), and a height of the bonding wire 7 needs to be reserved along a height direction of the packaging module. With miniaturization development of an electronic device, internal space of the electronic device is also gradually reduced. As a result, the packaging module in the conventional technology is not applicable to a miniaturized electronic device, and becomes a main factor restricting further miniaturization of the electronic device. Therefore, an embodiment of this disclosure provides a packaging module, to further miniaturize the packaging module by improving a combination manner of chips in the packaging module. The following describes in detail the packaging module provided in the embodiments of this disclosure with reference to specific accompanying drawings.

The packaging module provided in the embodiments of this disclosure is a system-level packaging module, and the system-level packaging module may include chips with different functions such as a CPU (central processing unit), SOC (system-on-chip), a DRAM (dynamic random access memory), and an NAND (NAND flash memory).

Figure 3:
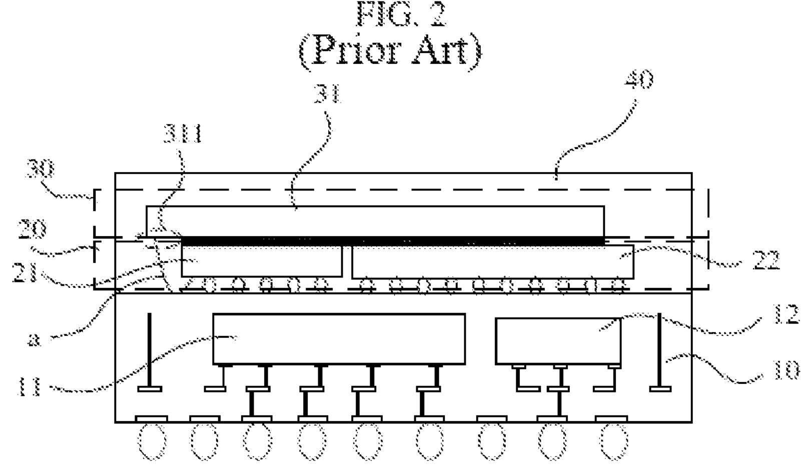
FIG. 3 is a schematic diagram of a structure of a packaging module according to an embodiment of this disclosure.

FIG. 3 is a schematic diagram of a cross section of a packaging module according to an embodiment of this disclosure. The packaging module includes a substrate layer 10 and a plurality of chip layers, and layer structures of the packaging module are named for ease of description. The plurality of chip layers of the packaging module include a top chip layer 30 and a bottom chip layer 20. The top chip layer 30 is a chip layer furthest from the substrate layer 10 in the plurality of chip layers, and the bottom chip layer 20 is a chip layer closest from the substrate layer 10 in the plurality of chip layers. In a structure shown in FIG. 3, the substrate layer 10, the bottom chip layer 20, and the top chip layer 30 are stacked in a vertical direction (the vertical direction may also be referred to as a thickness direction of the packaging module, and the thickness direction of the packaging module is the same as that of the substrate layer 10). The bottom chip layer 20 is an adjacent chip layer of the top chip layer 30. In addition, the bottom chip layer 20 is closer to the substrate layer 10 than the top chip layer 30.

The substrate layer 10 serves as a structure for carrying the top chip layer 30 and the bottom chip layer 20. In addition, the substrate layer 10 is further used to implement conductive connection between an external circuit and chips of the top chip layer 30 and the bottom chip layer 20. For example, a circuit layer is separately disposed on a surface of the substrate layer 10 and inside the substrate layer 10, and the circuit layer on the surface of the substrate layer 10 and the circuit layer inside the substrate layer 10 may be electrically connected by using a via.

In an optional solution, an embedded chip is disposed in the substrate layer 10, and the embedded chip is electrically connected to the circuit layer on the surface of the substrate layer 10 or the circuit layer embedded in the substrate layer 10 by using a via or a first conductor a. FIG. 3 shows two embedded chips: a first embedded chip 11 and a second embedded chip 12. The first embedded chip 11 and the second embedded chip 12 are conductively connected to the circuit layer of the substrate layer 10 by using a via. It should be understood that, although two embedded chips are shown in FIG. 3, a quantity of embedded chips is not specifically limited in the packaging module provided in this embodiment of this disclosure, and the quantity of embedded chips may be one, three, or the like.

In an optional solution, the substrate layer 10 may be a printed circuit board or another type of circuit board.

The bottom chip layer 20 is a layer structure formed by chips disposed at a same layer. For example, a chip of the bottom chip layer 20 includes one or more chips. The one or more chips are chips used to connect to a first chip 31 of the top chip layer. As shown in FIG. 3, for example, the bottom chip layer 20 includes a second chip 21 and a third chip 22. When the chip of the bottom chip layer 20 is disposed, a connection surface or connection surfaces of the one or more chips faces or all face the substrate layer 10 and is or are conductively connected to the circuit layer of the substrate layer 10. For example, a connection surface of the second chip 21 faces the substrate layer 10, and is conductively connected to the circuit layer of the substrate layer 10 by using a solder ball. A connection surface of the third chip 22 faces the substrate layer 10, and the connection surface of the third chip 22 is conductively connected to the circuit layer of the substrate layer 10. During assembly, the connection surface of the second chip 21 is conductively connected to the circuit layer of the substrate layer 10 by using a solder ball, and the connection surface of the third chip 22 is conductively connected to the circuit layer of the substrate layer 10 by using a solder ball. The second chip 21 and the third chip 22 may be electrically connected to the embedded chip (the first embedded chip or the second embedded chip) by using the circuit layer of the substrate layer 10.

It should be understood that the packaging module provided in this embodiment of this disclosure does not limit a quantity of chips of the bottom chip layer 20, and different quantities of chips may be disposed as required. For example, the quantity of chips of the bottom chip layer 20 is one, two, or three.

The top chip layer 30 is a layer structure formed by chips disposed at a same layer. The top chip layer 30 includes the first chip 31. In FIG. 3, for example, the top chip layer 30 includes one first chip 31. The first chip 31, the second chip 21, and the third chip 22 are stacked. A connection surface of the first chip 31 faces the substrate layer 10, and the connection surface of the first chip 31 is conductively connected to the connection surface of the second chip 21 by using the first conductor a. To be specific, one end of the first conductor a is connected to the connection surface of the first chip 31, and the other end thereof is connected to a connection surface of a chip (the second chip 21) of an adjacent chip layer. For example, the first conductor a may be a bonding wire or another type of conducting wire.

Still referring to FIG. 3, when being disposed, the first conductor a is disposed on a side of the first chip 31 facing the substrate layer 10, and a highest point of the first conductor a is lower than an upper surface of the first chip 31 (a surface facing away from the substrate layer 10).

When the first chip 31 is connected to the second chip 21, the connection surface of the first chip 31 is separately bonded, by using an adhesive, to an upper surface that is of the second chip 21 and that faces away from the connection surface and an upper surface that is of the third chip 22 and that faces away from the connection surface. The connection surface of the first chip 31 is provided with an exposed connection area 311 relative to the second chip 21 and the third chip 22. One end of the first conductor a is connected to the connection area 311. As shown in FIG. 3, for example, the connection area 311 is located in an edge area of the connection surface of the first chip 31. Therefore, disposition of the first conductor a is facilitated.

The packaging module provided in this embodiment of this disclosure further includes a packaging layer 40. The packaging layer 40 wraps the bottom chip layer 20, the top chip layer 30, the first conductor a between the bottom chip layer 20 and the top chip layer 30, and the solder ball used for connecting the bottom chip layer 20 to the substrate layer 10, to protect a component such as the chip in the packaging module.

To facilitate understanding of the packaging module provided in this embodiment of this disclosure, the following describes in detail preparation steps of the packaging module.

Step 1: Attach the first chip 31 to a carrying plate 400.

Figure 4A:
FIG. 4*a* to FIG. 4*g* are production flowcharts of a packaging module according to an embodiment of this disclosure.
Figure 4A:
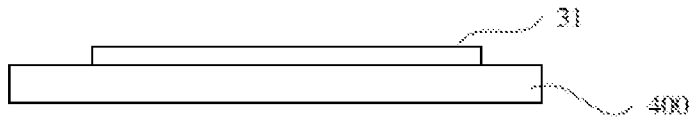

Referring to FIG. 4*a*, the carrying plate 400 may be prepared by using a material such as metal, glass, or silicon. The carrying plate 400 is covered with a layer of film adhesive material, and this layer of material is used to fasten the first chip 31. The film adhesive material may be a light sensitive or thermosensitive material. After being lit by ultraviolet light or under a specific heating condition, an adhesive force of the material is greatly reduced, to facilitate an interface separation operation later. When the first chip 31 is fastened on the carrying plate 400, the connection surface of the first chip 31 faces away from the carrying plate 400. A thickness range of the first chip 31 may be 25 μm to 400 μm. For example, a thickness of the first chip 31 may be 25 μm, 50 μm, 80 μm, or 400 μm.

Step 2: Attach the third chip 22 and the second chip 21 to the first chip 31.

Figure 4B:
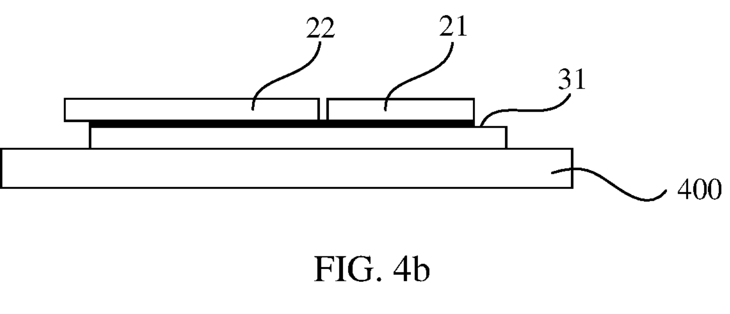

Referring to FIG. 4*b*, an adhesive material is provided at a bottom of the third chip 22 and a bottom of the second chip 21, and is used to bond and fasten the third chip 22 and the second chip 21 on the first chip 31. A surface of the third chip 22 and a surface of the second chip 21 each are provided with a solder pad structure (not shown in the figure), to be connected to the circuit layer of the substrate layer. When the third chip 22 and the second chip 21 are fastened to the first chip 31, a solder pad (a structure on the connection surface) of the third chip 22 and a solder pad of the second chip 21 face away from the first chip 31. The second chip 21, the third chip 22, and the first chip 31 form a stack chip.

A bonding material used for bonding between the third chip 22 and the second chip 21 and the first chip 31 may be cured at a specific temperature or in an ultraviolet environment. The thickness of the first chip 31 is set to be the same as a thickness of the second chip 21. For example, a thickness range of each of the third chip 22 and the second chip 21 is 25 μm to 400 μm. For example, the thickness of the second chip 21 and a thickness of the third chip 22 each are 25 μm, 50 μm, 80 μm, or 400 μm.

Step 3: Connect the first chip 31 and the second chip 21 by using a bonding wire.

Figure 4C:
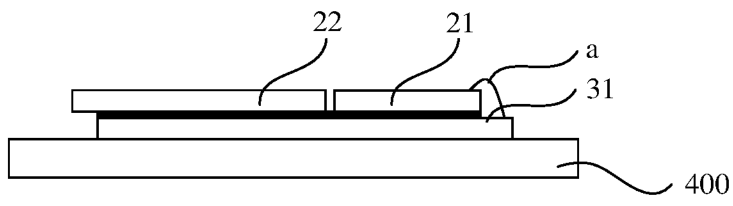

Referring to FIG. 4*c*, a wire bonding process is used to implement bonding wire connection on the connection surface of the first chip 31 and the solder pad of the second chip 21. Wire bonding refers to tightly welding a metal lead and a substrate solder pad by using a fine bonding wire through heat, pressure, and ultrasonic energy. A gold, copper, or alloy bonding wire may be used as the foregoing bonding wire, and a diameter of the bonding wire may be 18 μm to 30 μm. For example, the diameter of the bonding wire is 18 μm, 25 μm, or 30 μm.

Step 4: Take out the stack chip from the carrying plate 400 and place the stack chip upside down.

Figure 4D:
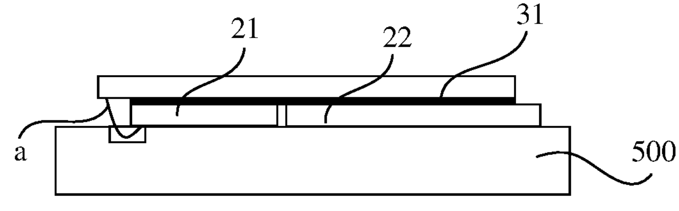

Referring to FIG. 4*d*, the adhesive force of the film adhesive material on the carrying plate 400 is greatly reduced because of ultraviolet light or heating, and then the second chip 21 and an upper surface of the second chip 21 are suctioned by a vacuum rubber suction nozzle. The vacuum rubber suction nozzle is driven up by a lifting device to separate the first chip 31 from the carrying plate 400, and a stack chip structure is placed on a temporary carrying table 500 upside down.

Step 5: Manufacture the substrate layer 10, and implant a metal bump 13 on the surface of the substrate layer 10.

Figure 4E:
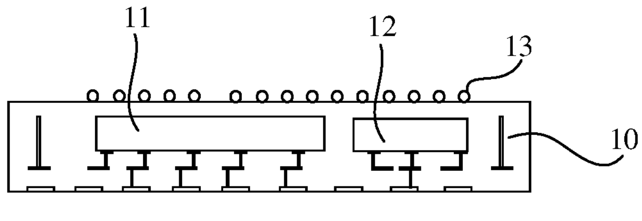

Referring to FIG. 4*e*, the substrate layer 10 is implemented by using a fan-out molding technology or a panel level package technology. The substrate layer 10 is embedded with the first embedded chip 11 and the second embedded chip 12, and the first embedded chip 11 and the second embedded chip 12 implement a rewiring structure on the surface of the substrate layer 10 by using the circuit layer and the via respectively, to fan out a connection end of the first embedded chip 11 and a connection end of the second embedded chip 12. The circuit layer on the surface of the substrate layer 10 includes a solder pad structure, and the metal bump 13 is implanted into the solder pad structure to connect to the main board or another circuit structure. The circuit layer on the surface of the substrate layer 10 may be made of a copper material, a material of the solder pad structure may use copper, and a material of the bump on the solder pad may use copper or tin.

When the metal bump 13 is prepared onto the substrate layer 10, the metal bump 13 is implanted into the solder pad structure by printing or electroplating. A height of the metal bump 13 may be 20 μm to 70 μm. For example, the height of the metal bump 13 is 20 μm, 40 μm, or 70 μm.

Step 6: Bond the stack chip structure with the substrate layer 10 by using the metal bump.

Figure 4F:
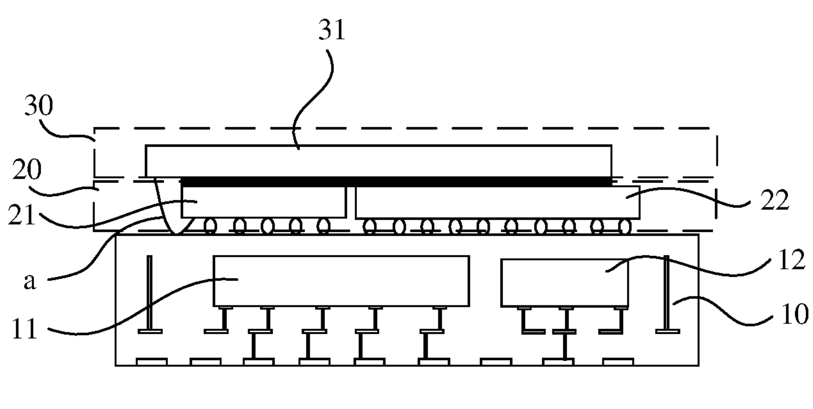

Referring to FIG. 4*f*, the stack chip structure and the substrate layer 10 are placed together, so that the metal bump is aligned with a pad corresponding to the third chip 22 and a pad corresponding to the second chip 21. The metal bump is metal bonded with the pad on the third chip 22 and the pad on the second chip 21 through a reflow soldering process or a hot press-fitted process. In the foregoing preparation process, a temperature is risen through the reflow soldering process and the hot press-fitted process to melt solder and melt bond the solder with a material of the metal bump.

Step 7: Plastically package an entire packaging structure and implant a solder ball into the substrate layer 10.

Figure 4G:
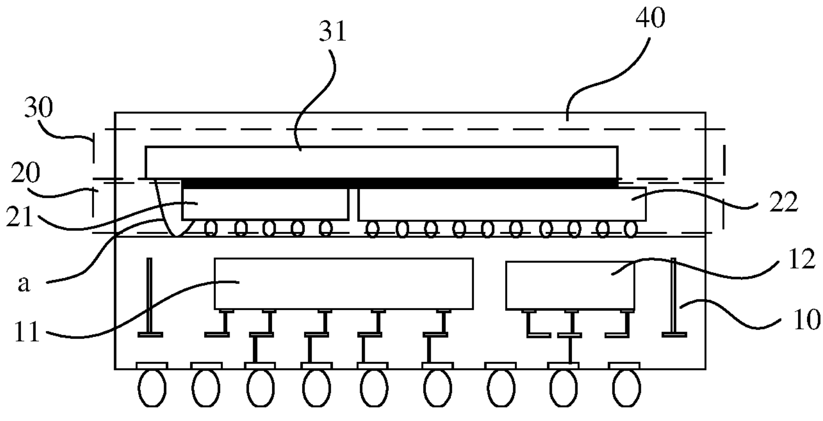

Referring to FIG. 4*g*, an entire chip structure may be packaged by using a molding tool and a thermosetting material, and a packaging material is cured by heating to form the packaging layer 40. Finally, the solder ball is implanted into a lower surface of the substrate layer 10, and the solder ball may be implanted through solder printing and reflow soldering.

It can be learned from the foregoing description that, in the packaging module provided in this embodiment of this disclosure, the first chip 31 is inverted (the connection surface of the first chip 31 faces the substrate layer 10), so that a height value of the first conductor a for connecting the first chip 31 to the second chip 21 may be within a thickness range of the second chip 21, and no additional height is required. Therefore, the packaging module can be thinner.

To facilitate understanding of a thinning effect of the packaging module provided in this embodiment of this disclosure, the packaging module provided in this embodiment of this disclosure is compared with the packaging module in the conventional technology shown in FIG. 2.

In this embodiment of this disclosure, the chip shown in FIG. 2 is disposed in a positive mounting manner, and connection surfaces of the chips (the chip 3 and the chip 4) face away from the substrate layer. Therefore, when the chip is connected to the second substrate, the bonding wire needs to be routed out from a top of the chip 4. When the bonding wire is routed, a necessary bending radian needs to be reserved, and a thickness from the packaging layer 5 to a top chip (the chip 4) should reach at least 100 μm, to cover the bonding wire. However, in the packaging module provided in this embodiment of this disclosure, because the connection surface of the first chip faces the substrate layer, the bonding wire is disposed toward the substrate layer. Although a bending radian needs to be reserved when the bonding wire is connected to a chip of the bottom chip layer, space occupied by bending of the bonding wire overlaps space of the solder ball used for welding the bottom chip layer and the substrate layer, so that no additional space is required. It can be seen from FIG. 3 of this disclosure that, a highest point (a point connected to the connection surface of the first chip) of the bonding wire along a chip stacking direction is lower than the upper surface of the first chip, to effectively lower a limitation on a thickness from the packaging layer to a top surface of the first chip. Therefore, the packaging module can be thinner, and a size of the packaging module is minimized.

In addition, the system-level packaging module in the conventional technology includes two substrates (the first substrate 1 and the second substrate 2), so that a packaging thickness of the packaging module is increased. However, in this embodiment of this disclosure, some chips (the first embedded chip 11 and the second embedded chip 12) are disposed in an embedding manner, and other chips (the first chip 31, the second chip 21, and the third chip 22) are directly bonded with the substrate layer 10. This saves a thickness of one substrate component compared with the system-level packaging module shown in FIG. 2, and reduces an overall thickness of the packaging module. In addition, by using a direct bonding manner of the chip and the substrate layer, more I/O (input/output) connections can be implemented compared with the conventional system-level packaging module, to increase connection bandwidth between chips of the system-level packaging module or reduce power consumption.

It can be learned from the foregoing description that, compared with the packaging module in the conventional technology, the packaging module disclosed in this embodiment of this disclosure can greatly reduce a packaging occupation height. For example, in the conventional technology, an occupation height of a packaging layer in a stacking packaging module of a processor chip of a mobile phone is about 1.2 mm, and an occupation height of a packaging layer in a stacking packaging module of a processor of a smartwatch is about 0.8 mm. However, a thickness of the packaging layer in the packaging module provided in this embodiment of this disclosure is only about 0.5 mm In addition, compared with a solution in the conventional technology in which the packaging module uses two substrates, in the packaging module provided in this embodiment of this disclosure, when a chip is directly connected to the substrate layer, a quantity of I/O interconnections of chips inside the packaging module can be increased. For example, in the conventional technology, a quantity of I/O connections between a CPU and upper-layer DRAM packaging in a stacking packaging module is about 200, and a quantity of I/O connections between an embedded chip and an upper-layer chip that are of the substrate layer provided in this embodiment of this disclosure is greater than 500. This greatly increases the quantity of I/O connections, and further increases connection bandwidth or reduces power consumption.

Figure 5:
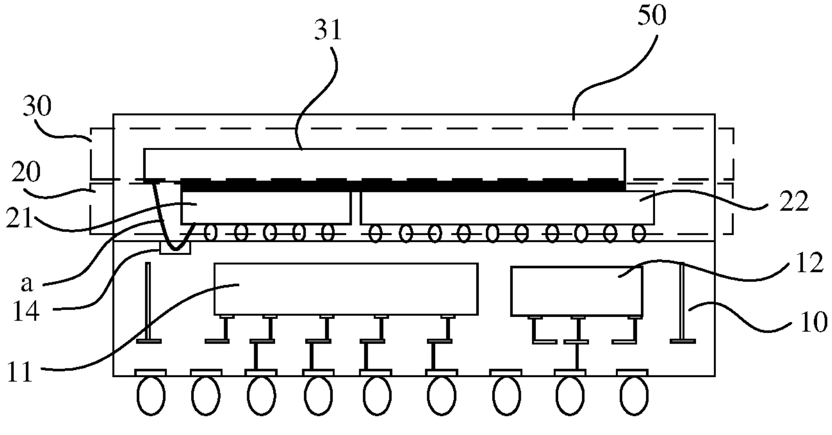
FIG. 5 is a schematic diagram of a structure of another packaging module according to an embodiment of this disclosure.

FIG. 5 shows a variant structure based on the packaging module shown in FIG. 3. The second chip 21 and the third chip 22 are located at the bottom chip layer 20, and the first chip 31 is located at the top chip layer 30. For connection manners of the second chip 21 and the third chip 22 and the substrate layer 10, refer to related descriptions in FIG. 3. Details are not described herein again.

The substrate layer 10 may also be provided with an avoidance groove 14 for avoiding the bonding wire, and the avoidance groove 14 is located on a surface of the substrate layer 10 facing the second chip. A disposed location, width, and depth of the avoidance groove 14 may be matched based on a location and a size of a bending structure of a bonding wire a connected to the first chip 31 and the second chip 21. This is not specifically limited in this embodiment of this disclosure.

In addition, a quantity of avoidance grooves 14 is not specifically limited in this embodiment of this disclosure, and the quantity may match a quantity of bonding wires a, or the quantity of avoidance grooves 14 is less than the quantity of bonding wires a. During arrangement, one avoidance groove 14 may accommodate a bending structure of one bonding wire a, or one avoidance groove 14 accommodates bending structures of a plurality of bonding wires a. During specific disposition, a location of the avoidance groove 14 and the quantity of avoidance grooves 14 may be flexibly arranged based on metal routing of the circuit layer on the surface of the substrate layer 10, to prevent a disposed avoidance groove 14 from affecting the metal routing of the circuit layer.

It can be seen from FIG. 5 that, when the avoidance groove 14 is disposed, a size of the packaging module can be further reduced, so that the solder ball connecting the second chip 21 and the third chip 22 to the substrate layer 10 can have a smaller size, to further reduce a height of the packaging module. In addition, the avoidance groove 14 is disposed, so that the bonding wire has larger space for bending. This ensures reliability of the bonding wire after being bent.

Figure 6:
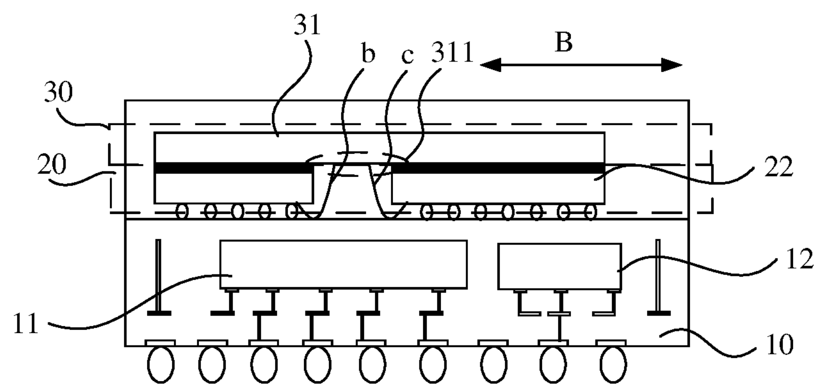
FIG. 6 is a schematic diagram of a structure of another packaging module according to an embodiment of this disclosure.

FIG. 6 shows another variant structure based on the packaging module shown in FIG. 3. The second chip 21 and the third chip 22 are located at the bottom chip layer 20, and the first chip 31 is located at the top chip layer 30. For connection manners of the second chip 21 and the third chip 22 and the substrate layer 10, refer to related descriptions in FIG. 3. Details are not described herein again.

In a packaging structure shown in FIG. 6, the second chip 21 and the third chip 22 of the packaging module are separately connected to a middle area of the first chip 31. As can be seen from FIG. 6, the connection area 311 of the first chip 31 is located in the middle area of the connection surface of the first chip 31, the second chip 21 and the third chip 22 are arranged at intervals, and space for exposing the connection area 311 is disposed at intervals between the second chip 21 and the third chip 22. When the first chip 31 is connected to the second chip 21 and the third chip 22, the first chip 31 is conductively connected to the second chip 21 by using one first conductor, and the first chip 31 is conductively connected to the third chip 22 by using another first conductor.

The first conductor uses a bonding wire. For example, a bonding wire b and a bonding wire c are located in a gap between the second chip 21 and the third chip 22. When the packaging structure shown in FIG. 6 is used, space for accommodating the bonding wire b and the bonding wire c is formed between the second chip 21 and the third chip 22 by utilizing a difference in a size of the first chip 31, a size of the second chip 21, and a size of the third chip 22. Therefore, the bonding wire b and the bonding wire c do not affect a size of the packaging module in a horizontal direction (a direction B shown in FIG. 6). This further reduces the size of the packaging module, and facilitates miniaturization of the packaging module.

In addition, the packaging module shown in FIG. 6 may also use the avoidance groove shown in FIG. 5. To be specific, an avoidance groove matching the bonding wire b and the bonding wire c may also be disposed on the substrate layer 10 of the packaging module shown in FIG. 6, to further reduce a height of the packaging module.

Figure 7:
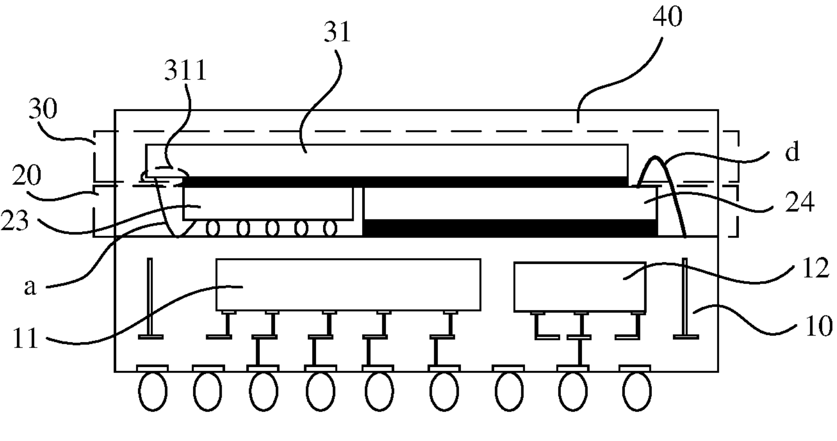
FIG. 7 is a schematic diagram of a structure of another packaging module according to an embodiment of this disclosure.

FIG. 7 shows a packaging module obtained by a variation based on the packaging module shown in FIG. 3. For some reference numerals in FIG. 7, refer to the same reference numerals in FIG. 3. A fourth chip 23 and a fifth chip 24 are located at the bottom chip layer 20, and the first chip 31 is located at the top chip layer 30.

In the packaging module shown in FIG. 7, routed-out surfaces of some chips of the bottom chip layer 20 face the substrate layer 10. As shown in FIG. 7, a routed-out surface of the fourth chip 23 faces the substrate layer 10. For a connection manner of the fourth chip 23 and the substrate layer 10, refer to related descriptions of the second chip 21 and the substrate layer 10 in FIG. 3. Details are not described herein again. When the fifth chip 24 is disposed, the fifth chip 24 is bonded with the substrate layer 10, and a connection surface of the fifth chip 24 faces away from the substrate layer 10. The connection surface of the fifth chip 24 is conductively connected to the circuit layer of the substrate layer 10 by using a second conductor. For example, the second conductor may use a bonding wire d.

When the first chip 31 and the fifth chip 24 are disposed, the fifth chip 24 and the first chip 31 are disposed in a staggered manner, so that the connection surface of the fifth chip 24 is exposed at an outer side of the first chip 31, and the bonding wire d is connected to a part of the connection surface of the fifth chip 24 exposed at the outer side of the first chip 31.

In an optional solution, a height of the bonding wire d is lower than a height of a surface of the first chip 31 facing away from the substrate layer 10, to prevent the disposed bonding wire d from affecting a height of the packaging module.

Figure 8:
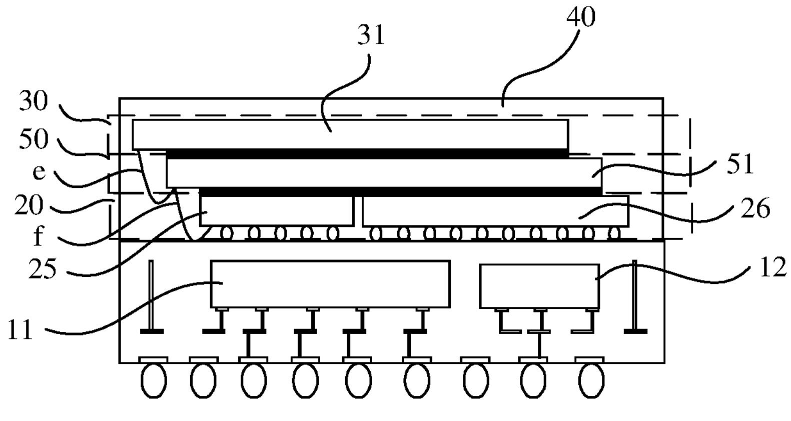
FIG. 8 is a schematic diagram of a structure of another packaging module according to an embodiment of this disclosure.

FIG. 8 shows another variant structure based on the packaging module shown in FIG. 3. For some reference numerals in FIG. 8, refer to the same reference numerals in FIG. 3. A plurality of chip layers include the top chip layer 30, a middle chip layer 50, and the bottom chip layer 20. The bottom chip layer 20 is a chip layer closest to the substrate layer. The middle chip layer 50 is a chip layer located between the bottom chip layer 20 and the top chip layer 30, and the middle chip layer 50 is a chip layer adjacent to the top chip layer 30. The top chip layer 30 includes the first chip 31, and the middle chip layer includes a sixth chip 51. A connection surface of the sixth chip 51 faces the substrate layer 10, and the bottom chip layer 20 includes a seventh chip 25 and a tenth chip 26. A connection surface of the seventh chip 25 and a connection surface of the tenth chip 26 face the substrate layer 10 and are conductively connected to the circuit layer of the substrate layer 10.

For connection manners of the seventh chip 25 and the tenth chip 26 of the bottom chip layer 20 and the substrate layer 10, refer to the connection manners of the second chip 21 and the third chip 22 and the substrate layer 10 shown in FIG. 3. Details are not described herein again.

The connection surface of the sixth chip 51 is separately conductively connected to the connection surface of the first chip 31 and the connection surface of the seventh chip 25 by using first conductors. As shown in FIG. 8, the first conductor is a bonding wire e and a bonding wire f. The first chip 31 and the sixth chip 51 are connected by using the bonding wire e, and the sixth chip 51 and the seventh chip 25 are connected by using the bonding wire f. For a specific connection manner, refer to the manner in which the first chip 31 and the second chip 21 are connected by using the bonding wire a in FIG. 3. Details are not described herein again.

Figure 9:
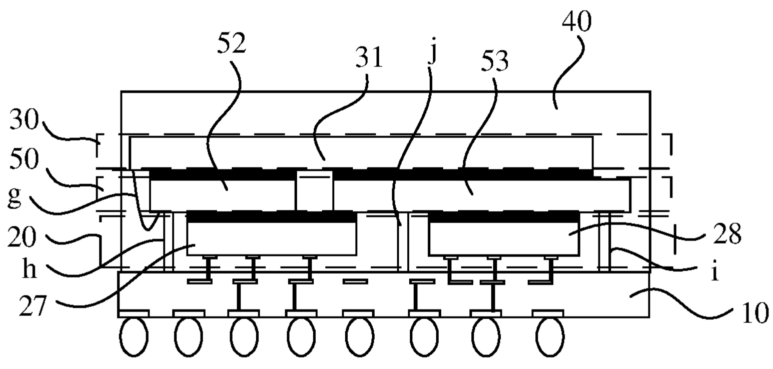
FIG. 9 is a schematic diagram of a structure of another packaging module according to an embodiment of this disclosure.

FIG. 9 shows another variant structure based on the packaging module shown in FIG. 3. In the structure shown in FIG. 9, it may be understood as that the embedded chip of the substrate layer 10 shown in FIG. 3 is disposed on a surface of the substrate layer.

In FIG. 9, a plurality of chip layers include the top chip layer 30, the middle chip layer 50, and the bottom chip layer 20. The bottom chip layer 20 is a chip layer closest to the substrate layer. The middle chip layer 50 is a chip layer located between the bottom chip layer 20 and the top chip layer 30, and the middle chip layer 50 is a chip layer adjacent to the top chip layer 20. The bottom chip layer 20 includes a ninth chip 27 and an eleventh chip 28, the middle chip layer 50 includes an eighth chip 52 and a twelfth chip 53, and the top chip layer 30 includes the first chip 31.

For connection manners of the ninth chip 27 and the eleventh chip 28 of the bottom chip layer 20 and the substrate layer 10, refer to the connection manners of the second chip 21 and the third chip 22 and the substrate layer 10 shown in FIG. 3. Details are not described herein again.

A connection surface of the ninth chip 27 and a connection surface of the eleventh chip 28 both face the substrate layer 10. The ninth chip 27 and the eleventh chip 28 are conductively connected to the circuit layer of the substrate layer 10 by using a solder pad. In addition, the ninth chip 27 and the eleventh chip 28 are spaced at intervals, to reserve routing space for conductive connection between another chip and the circuit layer of the substrate layer 10.

The eighth chip 52 of the middle chip layer 50 and the ninth chip 27 are bonded by adhesive. The eighth chip 52 and the ninth chip 27 are disposed in a staggered manner, so that the eighth chip 52 is partially exposed outside the ninth chip 27. A connection surface of the eighth chip 52 faces the substrate layer 10, and a part of the connection surface of the eighth chip 52 exposed outside the ninth chip 27 is conductively connected to the circuit layer of the substrate layer 10 by using a conductive column h. The twelfth chip 53 is bonded with the ninth chip 27 and the eleventh chip 28 by adhesive. The twelfth chip 53 and the eleventh chip 28 are disposed in a staggered manner, so that the twelfth chip 53 is partially exposed outside the eleventh chip 28. A connection surface of the twelfth chip 53 faces the substrate layer 10, and a part of the connection surface of the twelfth chip 53 exposed outside the ninth chip 27 and the eleventh chip 28 is conductively connected to the circuit layer of the substrate layer 10 by using a conductive column (a third conductor). As shown in FIG. 9, the twelfth chip 53 is conductively connected to the circuit layer of the substrate layer 10 by using a conductive column j and a conductive column i separately. It should be understood that a conductive connection manner of the twelfth chip 53 and the circuit layer of the substrate layer 10 shown in FIG. 9 is merely a specific example manner. In actual production, a routing design may be implemented based on a specific location of a chip.

The top chip layer 30 includes the first chip 31, and the first chip 31 is separately bonded with the eighth chip 52 and the twelfth chip 53 by adhesive. In addition, the first chip 31 and the eighth chip 52 are disposed in a staggered manner, so that the first chip 31 is partially exposed outside the eighth chip 52. The connection surface of the first chip 31 faces the substrate layer 10, and a part of the connection surface of the first chip 31 exposed outside the eighth chip 52 is conductively connected to the connection surface of the eighth chip 52 by using a bonding wire g (the first conductor).

It should be understood that, although the foregoing example shows that different chip layers include one or two chips, in this embodiment of this disclosure, a quantity of chips of each chip layer is not specifically limited, and different quantities of chips may be selected based on an actual situation.

It can be learned from the structure of the packaging module shown in FIG. 9 that, in the packaging module provided in this embodiment of this disclosure, a chip of a top layer is inverted, so that a conductor for a conductive connection between the chip of the top layer and a chip of another layer does not occupy space of the packaging module. A size of the packaging module is reduced. In addition, although the packaging module shown in FIG. 9 does not use an embedded chip, the packaging module shown in FIG. 9 reduces a quantity of used substrates compared with the packaging module shown in FIG. 2. This also reduces the size of the packaging module.

An embodiment of this disclosure further provides an electronic device such as a mobile phone or a smartwatch. A structure of the electronic device shown in FIG. 1 is used as an example. The electronic device includes the housing 100 and the main board 200 disposed in the housing 100. The packaging module 300 is fastened on the main board 200 and is conductively connected to the main board 200. When the packaging module 300 uses the packaging module in the foregoing example, all chips are supported by one substrate (a substrate layer), to reduce a quantity of used substrates, and further reduce a thickness of the packaging module. In addition, a connection surface of a first chip faces the substrate layer, so that a first conductor connected to the first chip and another chip does not occupy additional space, to reduce the thickness of the packaging module, and facilitate miniaturization of the packaging module.

A person skilled in the art can make various modifications and variations to this disclosure without departing from the scope of this disclosure. This disclosure is intended to cover these modifications and variations of this disclosure provided that the modifications and variations fall within the scope of protection defined by the following claims and their equivalent technologies.

What is claimed is:

1. A packaging module comprising:

a substrate layer; and a plurality of chip layers stacked on the substrate layer, wherein the plurality of chip layers comprises a top chip layer and an adjacent chip layer, the adjacent chip layer is adjacent to the top chip layer, and the top chip layer is a chip layer furthest from the substrate layer; and the top chip layer comprises a first chip, a first connection surface of the first chip faces the substrate layer, the adjacent chip layer comprises a chip, an adjacent connection surface of the chip of the adjacent chip layer faces the substrate layer, and the first connection surface of the first chip is conductively connected to the adjacent connection surface of the chip of the adjacent chip layer by using a first conductor.

2. The packaging module according to claim 1, wherein one end of the first conductor is connected to the first connection surface of the first chip, and the other end thereof is connected to the adjacent connection surface of the chip of the adjacent chip layer.

3. The packaging module according to claim 1, wherein the first conductor is located on a side of the first chip facing the substrate layer.

4. The packaging module according to claim 1, wherein the first connection surface of the first chip is provided with an exposed connection area relative to an upper surface of the chip of the adjacent chip layer, and one end of the first conductor is connected to the exposed connection area.

5. The packaging module according to claim 1 wherein the adjacent chip layer comprises one or more chips; a connection surface or connection surfaces of the one or more chips faces or all face the substrate layer and is or are conductively connected to a circuit layer of the substrate layer; and the first connection surface of the first chip is connected to any one of the connection surface or the connection surfaces of the one or more chips by using one first conductor.

6. The packaging module according to claim 5, wherein the adjacent chip layer comprises a plurality of chips, and the plurality of chips comprises a second chip and a third chip; a second connection surface of the second chip and a third connection surface of the third chip both face the substrate layer; and the second chip and the third chip are separately conductively connected to the circuit layer of the substrate layer; and the first chip is conductively connected to the second chip by using the first conductor; or the first chip is conductively connected to the second chip by using one first conductor, and the first chip is conductively connected to the third chip by using another first conductor.

7. The packaging module according to claim 5, wherein the adjacent chip layer comprises a plurality of chips, and the plurality of chips comprises a second chip and a third chip; a second connection surface of the second chip faces the substrate layer; and the first connection surface of the first chip is conductively connected to the second connection surface of the second chip by using the first conductor; and a third connection surface of the third chip faces away from the substrate layer; and the third connection surface of the third chip is conductively connected to the circuit layer of the substrate layer by using a second conductor.

8. The packaging module according to claim 6, wherein the substrate layer is provided with an avoidance groove for avoiding the first conductor.

9. The packaging module according to claim 1, wherein the plurality of chip layers further comprises a bottom chip layer, the bottom chip layer is a chip layer closest to the substrate layer, and the adjacent chip layer is located between the bottom chip layer and the top chip layer;

the adjacent connection surface of the chip of the adjacent chip layer faces the substrate layer, a chip located at the bottom chip layer comprises a second chip, and a second connection surface of the second chip faces the substrate layer and is conductively connected to a circuit layer of the substrate layer; and the adjacent connection surface of the chip of the adjacent chip layer is conductively connected to the first connection surface of the first chip by using one first conductor, and is conductively connected to the second connection surface of the second chip by using another first conductor.

10. The packaging module according to claim 1, wherein the packaging module further comprises an embedded chip disposed at the substrate layer, and the embedded chip is conductively connected to a circuit layer of the substrate layer.

11. The packaging module according to claim 1, wherein the plurality of chip layers further comprises a bottom chip layer, the bottom chip layer is a chip layer closest to the substrate layer, and the adjacent chip layer is located between the bottom chip layer and the top chip layer;

the adjacent connection surface of the chip of the adjacent chip layer faces the substrate layer, a chip located at the bottom chip layer comprises a second chip, and a connection surface of the second chip faces the substrate layer and is conductively connected to a circuit layer of the substrate layer;

the first connection surface of the first chip is conductively connected to the adjacent connection surface of the chip of the adjacent chip layer by using the first conductor; and the connection surface of the second chip is conductively connected to the circuit layer of the substrate layer by using another conductor.

12. The packaging module according to claim 1, wherein the chip layers in the plurality of chip layers are bonded.

13. The packaging module according to claim 1, wherein:

the plurality of chip layers are stacked on the substrate layer in a stacking direction; and a highest point of the first conductor connected to the first connection surface of the first chip along the stacking direction is lower than an upper surface of the first chip.

14. The packaging module according to claim 13, wherein the first chip and the chip of the adjacent chip layer are directly bonded with the substrate layer.

15. The packaging module according to claim 1, wherein:

the first conductor is a conducting wire;

one end of the conducting wire is connected to the first connection surface of the first chip;

the adjacent connection surface of the chip of the adjacent chip layer has disposed thereon a solder pad; and a second end of the conducting wire is connected to the solder pad.

16. An electronic device comprising:

a housing; and a packaging module disposed in the housing, wherein the packaging module comprises:

a substrate layer; and a plurality of chip layers stacked on the substrate layer, wherein the plurality of chip layers comprises a top chip layer and an adjacent chip layer, the adjacent chip layer is adjacent to the top chip layer, and the top chip layer is a chip layer furthest from the substrate layer; and the top chip layer comprises a first chip, a first connection surface of the first chip faces the substrate layer, the adjacent chip layer comprises a chip, an adjacent connection surface of the chip of the adjacent chip layer faces the substrate layer, and the first connection surface of the first chip is conductively connected to the adjacent connection surface of the chip of the adjacent chip layer by using a first conductor.

17. The electronic device according to claim 16, wherein one end of the first conductor is connected to the first connection surface of the first chip, and the other end thereof is connected to the adjacent connection surface of the chip of the adjacent chip layer.

18. The electronic device according to claim 16, wherein the first conductor is located on a side of the first chip facing the substrate layer.

19. The electronic device according to claim 16, wherein:

the plurality of chip layers are stacked on the substrate layer in a stacking direction; and a highest point of the first conductor connected to the first connection surface of the first chip along the stacking direction is lower than an upper surface of the first chip.

20. The electronic device according to claim 19, wherein the first chip and the chip of the adjacent chip layer are directly bonded with the substrate layer.

* * * * *